United States Patent
Hirano et al.

(10) Patent No.: US 7,239,016 B2
(45) Date of Patent: Jul. 3, 2007

(54) SEMICONDUCTOR DEVICE HAVING HEAT RADIATION PLATE AND BONDING MEMBER

(75) Inventors: Naohiko Hirano, Okazaki (JP); Nobuyuki Kato, Nisshin (JP); Kuniaki Mamitsu, Okazaki (JP); Yoshimi Nakase, Anjo (JP)

(73) Assignee: Denso Corporation, Kariya (JP)

( * ) Notice: Subject to any disclaimer, the term of this patent is extended or adjusted under 35 U.S.C. 154(b) by 154 days.

(21) Appl. No.: 10/895,947

(22) Filed: Jul. 22, 2004

(65) Prior Publication Data

US 2005/0077617 A1 Apr. 14, 2005

(30) Foreign Application Priority Data

| Oct. 9, 2003 | (JP) | ............................ 2003-350814 |
| Oct. 10, 2003 | (JP) | ............................ 2003-352513 |
| Nov. 26, 2003 | (JP) | ............................ 2003-395572 |

(51) Int. Cl.
H01L 23/34 (2006.01)

(52) U.S. Cl. ...................... 257/718; 257/719; 257/720; 257/712; 257/713; 257/E23.11; 257/E23.113

(58) Field of Classification Search ........ 257/712–713, 257/718–720, E23.11, E23.113
See application file for complete search history.

(56) References Cited

U.S. PATENT DOCUMENTS

| 5,651,179 | A | 7/1997 | Bessho et al. |
| 6,166,433 | A | 12/2000 | Takashima et al. |
| 6,281,575 | B1 | 8/2001 | Nishikawa et al. |
| 6,703,707 | B1 * | 3/2004 | Mamitsu et al. ............ 257/718 |
| 2002/0014703 | A1 * | 2/2002 | Capote et al. .............. 257/778 |
| 2002/0109211 | A1 | 8/2002 | Shinohara |
| 2003/0022464 | A1 | 1/2003 | Hirano et al. |

FOREIGN PATENT DOCUMENTS

| JP | A-6-163764 | 6/1994 |
| JP | A-2000-252387 | 9/2000 |

* cited by examiner

*Primary Examiner*—Zandra V. Smith
*Assistant Examiner*—Tsz Kit Chiu
(74) *Attorney, Agent, or Firm*—Posz Law Group, PLC

(57) ABSTRACT

A semiconductor device includes a heat generation element; a bonding member; first and second heat radiation plates disposed on first and second sides of the heat generation element through the bonding member; a heat radiation block disposed between the first heat radiation plate and the heat generation element through the bonding member; and a resin mold. The heat radiation block has a thickness in a range between 0.5 mm and 1.5 mm. The semiconductor device has high reliability of the bonding member.

24 Claims, 10 Drawing Sheets

SEMICONDUCTOR DEVICE HAVING HEAT RADIATION PLATE AND BONDING MEMBER

CROSS REFERENCE TO RELATED APPLICATIONS

This application is based on Japanese Patent Applications No. 2003-350814 filed on Oct. 9, 2003, No. 2003-352513 filed on October 10, and No. 2003-395572 filed on Nov. 26, 2003, the disclosures of which are incorporated herein by reference.

FIELD OF THE INVENTION

The present invention relates to a semiconductor device having a heat radiation plate and a bonding member.

BACKGROUND OF THE INVENTION

A semiconductor chip having high withstand voltage and large current capacity generates large heat while operating. Therefore, it is required to improve heat radiation radiated from the chip. In view of the heat radiation, a semiconductor device having a large current semiconductor chip is disclosed in Japanese Patent Application Publication No. 2003-110064 (i.e., U.S. Patent Application Publication No. 2003-0022464-A1). The semiconductor device includes a pair of heat sinks made of metal, which are disposed on both sides of the semiconductor chip through a solder layer. Specifically, the heat sinks are bonded to the semiconductor chip with the solder layer. Thus, the heat generated in the chip is radiated from both sides of the chip through the heat sinks. Therefore, the heat radiation efficiency is improved. Here, the semiconductor device having the heat sinks is molded with resin. However, the outside surface of each heat sink is exposed from the resin mold so that the heat radiation efficiency becomes effectively.

In the above semiconductor device, each thermal expansion coefficient of the semiconductor chip, the heat sink and the resin mold is different each other. Therefore, a large heat stress is generated at each bonding portion between them. The large heat stress may crack the chip. To protect the chip, the thickness of the chip is thinned so that a distortion at the bonding portion between the chip and the solder layer becomes small.

However, in the above semiconductor device, dimensions and shape of the heat sink are not defined. Therefore, a strain in the solder layer disposed between the chip and the heat sink may be increased so that the bonding member cracks by the strain.

SUMMARY OF THE INVENTION

In view of the above-described problem, it is an object of the present invention to provide a semiconductor device having high reliability of a bonding member. Specifically, a strain in the bonding member disposed between a heat generation element and a heat radiation plate is reduced so that the bonding member is prevented from cracking. Further, even if the crack is generated in the bonding member, the crack does not affect the heat radiation so that the performance of the heat radiation is not reduced substantially.

A semiconductor device includes: a heat generation element; a bonding member; first and second heat radiation plates disposed on first and second sides of the heat generation element through the bonding member, respectively; a heat radiation block disposed between the first heat radiation plate and the heat generation element through the bonding member; and a resin mold molding almost all of the device. The first and second heat radiation plates are capable of radiating heat generated from the heat generation element. The heat generation element electrically and thermally connects to the first heat radiation plate through the bonding member and the heat radiation block. The heat generation element electrically and thermally connects to the second heat radiation plate through the bonding member. The heat radiation block has a thickness in a range between 0.5 mm and 1.5 mm. In the device, a strain in the bonding member disposed between the heat generation element and the heat radiation plate is reduced so that the bonding member is prevented from cracking. Thus, the reliability, i.e., the strength of the bonding member disposed between the heat generation element and the heat radiation plate is improved so that the semiconductor device has high reliability of the bonding member.

Preferably, the second side of the heat generation element has an edge portion with no corner, and the second side of the heat generation element faces the second heat radiation plate through the bonding member.

Further, a semiconductor device includes: a heat generation element; a bonding member; first and second heat radiation plates disposed on first and second sides of the heat generation element through the bonding member, respectively; a heat radiation block disposed between the first heat radiation plate and the heat generation element through the bonding member; and a resin mold molding almost all of the device. The first and second heat radiation plates are capable of radiating heat generated from the heat generation element. The heat generation element electrically and thermally connects to the first heat radiation plate through the bonding member and the heat radiation block. The heat generation element electrically and thermally connects to the second heat radiation plate through the bonding member. The heat radiation block has an edge portion with no corner so that the bonding member disposed at the edge portion becomes thick. The semiconductor device has high reliability of the bonding member.

Preferably, the heat radiation block has a surface having the edge portion with no corner, and the surface of the heat radiation block faces the heat generation element through the bonding member.

Further, a semiconductor device includes: a heat generation element; a bonding member; first and second heat radiation plates disposed on first and second sides of the heat generation element through the bonding member; a heat radiation block disposed between the first heat radiation plate and the heat generation element through the bonding member; and a resin mold molding almost all of the device. The first and second heat radiation plates are capable of radiating heat generated from the heat generation element. The heat generation element electrically and thermally connects to the first heat radiation plate through the bonding member and the heat radiation block. The heat generation element electrically and thermally connects to the second heat radiation plate through the bonding member. The heat radiation block has first and second surfaces. The first surface of the heat radiation block is disposed on a first heat radiation plate side, and the second surface of the heat radiation block is disposed on a heat generation element side. At least one of the first and second surfaces of the heat radiation block has a spherical shape. The semiconductor device has high reliability of the bonding member.

Further, a semiconductor device includes a heat generation element having a heat generation chip; a bonding member; a first heat radiation plate disposed on a first side of the heat generation element through the bonding member, wherein the heat generation chip is disposed on the first side of the heat generation element; a second heat radiation plate disposed on a second side of the heat generation element through the bonding member, wherein no heat generation chip is disposed on the second side of the heat generation element, and wherein the second side of the heat generation chip is opposite to the first side; and a resin mold molding almost all of the device. The first and second heat radiation plates are capable of radiating heat generated from the heat generation element. The heat generation element electrically and thermally connects to the first and second heat radiation plates through the bonding member. The resin mold has a linear coefficient of thermal expansion defined as $\alpha$. The first and second heat radiation plates have another linear coefficient of thermal expansion defined as $\beta$. The coefficients of $\alpha$ and $\beta$ have a relationship as $0.8 \times \beta \leq \alpha \leq 1.5 \times \beta$. In the above device, even if the crack is generated in the bonding member, the crack does not affect the heat radiation so that the performance of the heat radiation is not reduced substantially.

Preferably, the heat generation element further includes a device region and a non-device region. The heat generation chip is disposed in the device region so that the device region contributes to heat generation. No heat generation chip is disposed in the non-device region so that the non-device region does not contribute to the heat generation. The non-device region is disposed outside of the device region so that the non-device region surrounds the device region. The non-device region has a width, which is equal to or larger than a thickness of the heat generation element.

Further, a semiconductor device includes a heat generation element having a heat generation chip; a bonding member; a first heat radiation plate disposed on a first side of the heat generation element through the bonding member, wherein the heat generation chip is disposed on the first side of the heat generation element; a second heat radiation plate disposed on a second side of the heat generation element through the bonding member, wherein no heat generation chip is disposed on the second side of the heat generation element, and wherein the second side of the heat generation chip is opposite to the first side; and a resin mold molding almost all of the device. The first and second heat radiation plates are capable of radiating heat generated from the heat generation element. The heat generation element electrically and thermally connects to the first and second heat radiation plates through the bonding member. The heat generation element further includes a device region and a non-device region. The heat generation chip is disposed in the device region so that the device region contributes to heat generation. No heat generation chip is disposed in the non-device region so that the non-device region does not contribute to the heat generation. The non-device region is disposed outside of the device region so that the non-device region surrounds the device region. The non-device region has a width, which is equal to or larger than a thickness of the heat generation element. In the above device, even if the crack is generated in the bonding member, the crack does not affect the heat radiation so that the performance of the heat radiation is not reduced substantially.

Further, a semiconductor device includes a heat generation element having a heat generation chip; a bonding member; a wire terminal disposed on a first side of the heat generation element through the bonding member, wherein the heat generation chip is disposed on the first side of the heat generation element; a heat radiation plate disposed on a second side of the heat generation element through the bonding member, wherein no heat generation chip is disposed on the second side of the heat generation element, and wherein the second side of the heat generation chip is opposite to the first side; and a resin mold molding almost all of the device. The heat radiation plate is capable of radiating heat generated from the heat generation element. The heat generation element electrically and thermally connects to the heat radiation plate and the wire terminal through the bonding member, respectively. The resin mold has a linear coefficient of thermal expansion defined as $\alpha$. The heat radiation plate and the wire terminal have another linear coefficient of thermal expansion defined as $\beta$. The coefficients of $\alpha$ and $\beta$ have a relationship as $0.8 \times \beta \leq \alpha \leq 1.5 \times \beta$. In the above device, even if the crack is generated in the bonding member, the crack does not affect the heat radiation so that the performance of the heat radiation is not reduced substantially.

Further, a semiconductor device includes a heat generation element having a heat generation chip; a bonding member; a wire terminal disposed on a first side of the heat generation element through the bonding member, wherein the heat generation chip is disposed on the first side of the heat generation element; a heat radiation plate disposed on a second side of the heat generation element through the bonding member, wherein no heat generation chip is disposed on the second side of the heat generation element, and wherein the second side of the heat generation chip is opposite to the first side; and a resin mold molding almost all of the device. The heat radiation plate is capable of radiating heat generated from the heat generation element. The heat generation element electrically and thermally connects to the heat radiation plate and the wire terminal through the bonding member, respectively. The heat generation element further includes a device region and a non-device region. The heat generation chip is disposed in the device region so that the device region contributes to heat generation. No heat generation chip is disposed in the non-device region so that the non-device region does not contribute to the heat generation. The non-device region is disposed outside of the device region so that the non-device region surrounds the device region. The non-device region has a width, which is equal to or larger than a thickness of the heat generation element. In the above device, even if the crack is generated in the bonding member, the crack does not affect the heat radiation so that the performance of the heat radiation is not reduced substantially.

Further, a semiconductor device includes a heat generation element; a bonding member; first and second heat radiation plates disposed on first and second sides of the heat generation element through the bonding member; and a resin mold molding almost all of the device. The first and second heat radiation plates are capable of radiating heat generated from the heat generation element. The heat generation element electrically and thermally connects to the first and second heat radiation plates through the bonding member. The resin mold has a glass transition temperature, which is equal to or higher than an upper limit of an operating temperature of the device. In the device, even when a large stress is applied to the device, a strain in the bonding member disposed at a connecting portion between the heat generation element and the bonding member is reduced so that the bonding member is prevented from cracking. Thus, the reliability, i.e., the strength of the bonding member is improved so that the semiconductor device has high reliability of the bonding member.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

The inventors have studied about a heat radiation block (i.e., a heat sink block) in a semiconductor device. This is because dimensions and shape of the heat radiation block may affect a distortion at a bonding portion between the heat radiation block and a solder layer. Specifically, the distortion is analyzed by a finite element method (i.e., FEM). As a result, for example, when the heat radiation block is thick, a bonding member disposed between a heat generation element, i.e., a semiconductor chip and the heat radiation block becomes distorted largely. In this case, the bonding member may crack by a heat cycle stress. The detailed description is described as follows.

Figure 1:
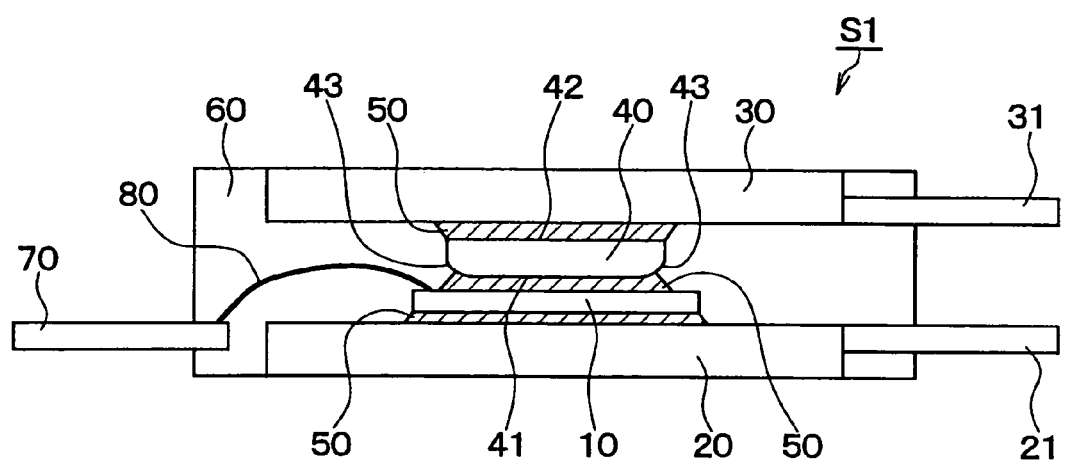
FIG. 1 is a cross sectional view showing a semiconductor device according to a first embodiment of the present invention.

FIG. 1 shows a semiconductor device S1 according to a first embodiment of the present invention. The device S1 includes a semiconductor chip 10 as a heat generation element, upper and lower heat sinks 20, 30 as a heat radiation plate, a heat sink block 40 as a heat radiation block, a bonding member 50 disposed between them. A resin mold 60 molds them. The bonding member 50 is, for example, made of a solder layer. The bottom of the chip 10 and the top of the lower heat sink 20 are bonded together with the bonding member 50, and the top of the chip 10 and the bottom of the heat sink block 41 are also bonded together with the bonding member 50. Further, the top 42 of the heat sink block 40 and the bottom of the upper heat sink 30 are bonded together with the bonding member 50. The bonding member 50 can be a conductive adhesive agent or the like.

In the above device S1, heat generated in the chip 10 radiates from the top of the chip 10 through the bonding member 50, the heat sink block 40, the bonding member 50 and the upper heat sink 30. Further, the heat generated in the chip 10 radiates from the bottom of the chip 10 through the bonding member 50 and the lower heat sink 20. Here, the semiconductor chip 10 includes, for example, a power device such as an insulated gate bipolar transistor (i.e., IGBT) and a thyristor. In this case, it is preferred that the chip 10 has a trench gate type construction. Further, the chip can be another semiconductor chip instead of the power device. Furthermore, the chip can have another device construction instead of the trench gate type construction.

The chip 10 is a rectangular thin plate. The upper and lower heat sinks 20, 30 and the heat sink block 40 are made of metal having good heat conductivity and electric conductivity, for example, copper alloy, aluminum alloy, or the like. The heat sink block 40 can be made of conventional iron alloy.

The upper and lower heat sinks 20, 30 are electrically connected to electrodes (not shown) such as a collector electrode or an emitter electrode in the chip 10 through the bonding member 50, i.e., the solder layer. The lower heat sink 20, as a whole, is a rectangular plate. The lower heat sink 20 includes a lower terminal 21 protruding toward outside of the device S1. The heat sink block 40 is, for example, slightly smaller than the chip 10. The heat sink block 40 is a rectangular plate. The upper heat sink 30, as a whole, is a rectangular plate. The upper heat sink 30 includes an upper terminal 31 protruding toward outside of the device S1. The upper and lower terminals 21, 31 are protruded toward the same direction. The upper terminal 31 of the upper heat sink 30 and the lower terminal 21 of the lower heat sink 20 connect to outside wirings of the device S1, respectively.

A resin mold 60 seals the device S1. Specifically, a pair of heat sinks 20, 30, the semiconductor chip 10 and the heat sink block 40 are sealed with the resin mold 60. The resin mold 60 is made of conventional mold material such as epoxy resin. When the heat sinks 20, 30 and the like are molded with the resin mold 60, a molding tool (not shown) composed of upper and lower molding tools is used for molding so that a transfer molding method is performed. Thus, the heat sinks 20, 30 and the like are molded.

A lead frame 70 is disposed around the chip 10 in the resin mold 60. The lead frame 70 is electrically connected to the chip 10 through a wire 80. The wire 80 is formed by a wire bonding method, and made of gold, aluminum or the like.

In the device S1, the thickness of the heat sink block 40 is in a range between 0.5 mm and 1.5 mm. Further, an edge portion 43 of the heat sink block 40 has a rounded shape (i.e., R-shape) so that the bonding member 50 disposed at the edge portion 43 becomes thicker. Although the edge portion 43 is the R-shape, the edge portion 43 of the heat sink block 40 can be a chamfered edge or another edge portion with no corner. Specifically, the bottom 41 of the heat sink block 40 faces the chip 10 through the bonding member 60. The edge portion 43 is disposed on the bottom 41 of the heat sink block 40 so that the bonding member 50 disposed between the bottom 41 of the heat sink block 40 and the chip 10 and disposed at the edge portion 43 of the heat sink block 40 becomes thicker.

The device S1 is manufactured as follows. At first, the chip 10 and the heat sink block 40 are soldered on the top of the lower heat sink 20. Specifically, the semiconductor chip 10 is laminated on the top of the lower heat sink 20 through the bonding member 50, i.e., the solder layer. Further, the heat sink block 40 is laminated on the chip 10 through the solder layer 50. After that, the solder layer 50 is melted and solidified by heating equipment (i.e., solder reflow equipment) so that the chip 10 and the heat sink block 40 are mounted on the lower heat sink 20.

Next, a control electrode such as a gate pad of the chip 10 and the lead frame 70 are electrically connected with a wire 80 by the wire bonding method. Then, the upper heat sink 30 is soldered on the heat sink block 40. In this case, the upper heat sink 30 is mounted on the heat sink block 40 through a solder foil. After that, the solder foil is melted and solidified by a heater. The solidified solder foil provides the bonding member 50. Thus, the lower heat sink 20, the chip 10, the heat sink block 40 and the upper heat sink 30 are bonded and electrically and thermally connected together through the bonding member 50.

Then, by using the molding tool (not shown), the resin is filled into the clearance between the heat sinks 20, 30 and molded at the periphery of the heat sinks 20, 30 so that resin mold 60 seals the clearance and the periphery of the heat sinks 20, 30. After the resin is solidified, the semiconductor device S1 is removed from the molding tool. Thus, the device SI is completed.

The bottom of the lower heat sink 20 and the top of the upper heat sink 30 are exposed from the resin mold 60 so that the heat radiation from the heat sinks 20, 30 is improved.

The upper and lower heat sinks 20, 30 as a heat radiation plate for radiating heat generated in the chip 10 as a heat generation element are disposed on both sides of the chip 10 through the bonding member 50. A heat sink block 40 is disposed between the chip 10 and the upper heat sink 30 through the bonding member 50 so as to connect electrically and thermally between the chip 10 and the upper heat sink 30. The thickness of the heat sink block 40 is in a range between 0.5 mm and 1.5 mm. Almost all of the device S1 is molded with the resin mold 60.

Figure 2:
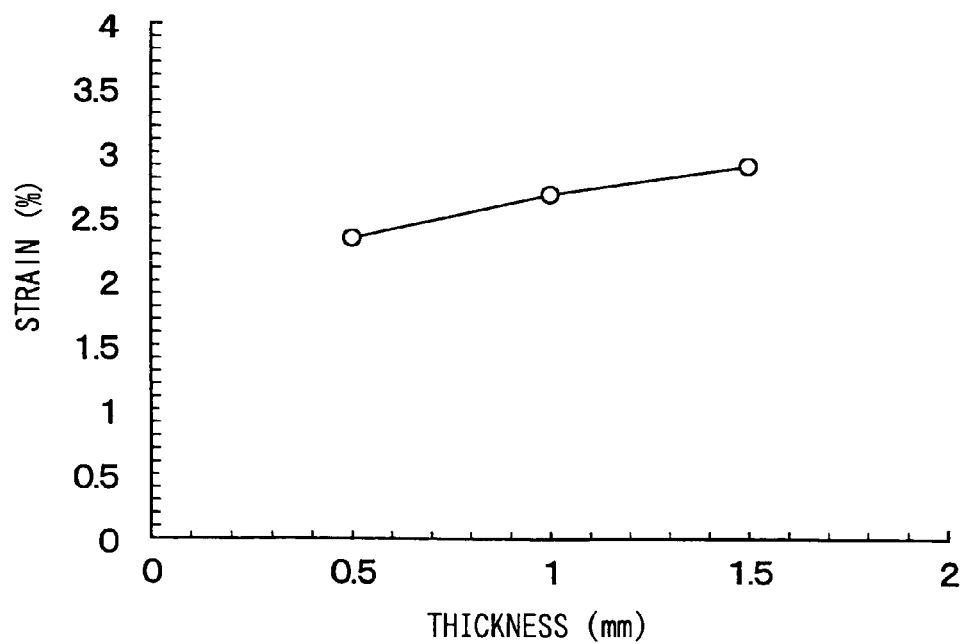
FIG. 2 is a graph showing a relationship between a shear plastic strain and a thickness of a heat sink block, according to the first embodiment.

The reason why the thickness of the heat sink block 40 is set to be in a range between 0.5 mm and 1.5 mm is described as follows. FIG. 2 shows shear plastic strain obtained by the FEM analysis. The shear plastic strain is generated in the bonding member 50 disposed on the chip 10 having different thickness of the heat sink block 40. Here, the edge portion 43 of the heat sink block 40 has a right-angled edge instead of the chamfered edge. As shown in FIG. 2, when the thickness of the heat sink block 40 is thin, the strain generated in the bonding member 50 becomes small so that the reliability on the bonding member is improved. This is because the bonding member 50 is protected from cracking when the strain in the bonding member 50 is small.

The heat sink block 40 is disposed between the chip 10 and the upper heat sink 30 so that the clearance between the chip 10 and the upper heat sink 30 is secured. When the thickness of the heat sink block 40 is thinner than 0.5 mm, it is difficult to secure sufficient space for the wire 80 to retrieve from the chip 10. Specifically, it is required to secure the sufficient clearance between the upper heat sink 30 and the chip 10 not to contact the wire 80 with the upper heat sink 30. The wire connects to the gate electrode of the chip 10. For example, when the height of the wire 80 is 1 mm, the thickness of the chip 10 is 0.2 mm, and the thickness of each bonding member is 0.1 mm, it is required that the thickness of the heat sink block 40 is equal to or thicker than 0.5 mm. Conversely, when the thickness of the heat sink block 40 is equal to or thicker than 0.5 mm, the clearance between the upper heat sink 30 and the chip 10 is sufficiently secured.

However, when the thickness of the heat sink block 40 becomes thicker, the strain in the bonding member 50 becomes large or thermal resistance and electric resistance of the heat sink block 40 become large. Therefore, the thickness of the heat sink block 40 is equal to or thinner than 1.5 mm. This upper limit of the thickness is determined by comprehensively considering an increasing ratio of the strain of the bonding member 50 obtained by the FEM analysis, and thermal resistance and electric resistance of the heat sink block 40.

Thus, when the thickness of the heat sink block 40 is in a range between 0.5 mm and 1.5 mm, the chip 10 and the upper heat sink 30 are connected thermally and electrically. Further, the clearance between the chip 10 and the upper heat sink 30 is secured. Furthermore, the strain in the bonding member 50 disposed between the chip 10 and the heat sink block 40 is reduced.

In this embodiment, the edge portion 43 of the heat sink block 40 is formed into the chamfered edge so that the thickness of the bonding member 50 disposed at the edge portion 43 becomes thicker. This is because the stress in the bonding member 50 is concentrated at the edge portion of the heat sink block 40, which is obtained by the analysis. Therefore, to improve the strength of the bonding member 50, the shape of the edge portion 43 of the heat sink block 40 is modified. Thus, the thickness of the bonding member 50 disposed at the edge portion 43 of the heat sink block 40 becomes thicker, the edge portion at which the stress is concentrated.

Figure 3:
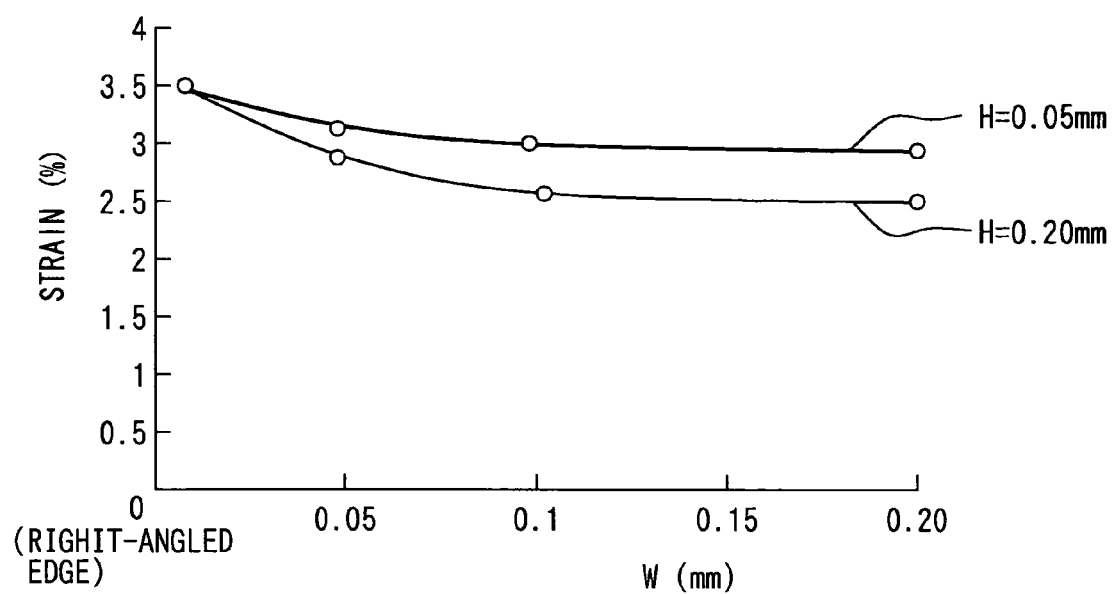
FIG. 3 is a graph showing a relationship between a shear plastic strain and a width of an edge portion, according to the first embodiment.
Figure 4:
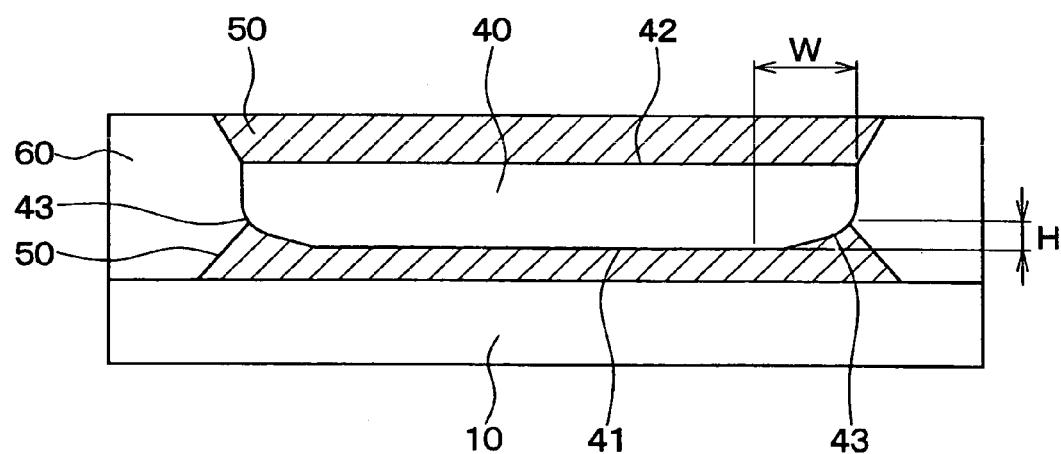
FIG. 4 is a partially enlarged cross sectional view showing the heat sink block of the device according to the first embodiment.

As shown in FIG. 1, the edge portion 43 of the heat sink block 40, which contacts the chip 10, has the R-shape. FIG. 3 shows shear plastic strain in the bonding member 50 of the device S1 having the R-shaped edge portion of the heat sink block 40, which is obtained by the FEM analysis. Specifically, the edge portion 43 has a width W and a height H, as shown in FIG. 4. The shear plastic strain in the bonding member 50 disposed on the chip 10 is obtained.

As shown in FIG. 3, when the edge portion 43 has the R-shape, i.e., when the width W of the edge portion is not null, the strain becomes smaller compared with the right-angled edge (i.e., the width W is null). This is because the thickness of the bonding member 50, i.e., the solder layer disposed at the edge portion 43 becomes thicker. The shear stress is concentrated at the edge portion 43. This result can be obtained in a case where the edge portion 43 of the heat sink block 40 is the chamfered edge. Further, the strain in the bonding member 50 in a case where the height H of the edge portion 43 is 0.20 mm is smaller than that in a case where the height H is 0.05 mm.

Thus, since the edge portion 43 of the heat sink block 40 is the chamfered edge or the rounding edge, of which the corner is cut (i.e., which has no corner), the stress concentration at the edge portion 43 of the heat sink block 40 is reduced compared with the edge portion 43 having the right-angled edge. Thus, the strain in the bonding member 50 disposed at the edge portion 43 is reduced.

Further, the thickness of the bonding member 50 becomes thicker since the corner of the edge portion 43 of the heat sink block 40 is removed. Therefore, the bonding member 50 disposed at the edge portion 43 of the heat sink block 40, at which the stress is concentrated easily, is secured to have sufficient strength.

Thus, the thickness of the heat sink block 40 and the shape of the edge portion 43 are defined so that the reliability, i.e., the strength of the bonding member 50 disposed between the chip 10 and the heat sink block 40 is improved.

As shown in FIG. 3, when the width W of the edge portion 43 is equal to or larger than 0.1 mm, and the height H of the edge portion 43 is in a range between 0.05 mm and 0.20 mm, the bonding member 50 has a sufficient reliability, i.e., sufficient strength.

In the first embodiment, the bottom 41 of the heat sink block 40, on which the edge portion 43 having the rounding edge is disposed, faces the chip 10 through the bonding member 50. In a conventional art, a heat sink block has a right-angled edge, so that the right-angled edge may damage a semiconductor chip. However, in this embodiment, the heat sink block 40 has the rounding edge, i.e., the edge portion 43 so that the semiconductor chip 10 is protected from damage.

The analysis further teaches that the stress is concentrated at the edge portion 43 of the heat sink block 40. Specifically, the stress is easily concentrated at the edge portion 43 disposed on the bottom 41 of the heat sink block 40, the bottom 41 which faces the chip 10, i.e., the heat generation element. Therefore, it is effective for reduction of the strain in the bonding member 50 to remove the corner of the heat sink block 40, the corner disposed on the bottom 41 of the heat sink block 40 facing the chip 10.

Here, the heat sink block 40 is made of material having good thermal conductivity and electric conductivity. For example, the heat sink block 40 is made of copper alloy, aluminum alloy or conventional iron alloy.

Further, the Young's modulus of the heat sink block 40 is in a range between 60 GPa and 240 GPa. In this case, the strain in the bonding member 50, i.e., the solder layer is not affected substantially. This is also obtained by the FEM analysis.

The device S1 can have the heat sink block 40 with the thickness in a range between 0.5 mm and 1.5 mm, and have the edge portion 43 formed into the conventional right-angled edge. In this case, since the thickness of the heat sink block 40 is in a range between 0.5 mm and 1.5 mm, the device can have similar advantage of the device S1 shown in FIG. 1. Thus, the reliability, i.e., the strength of the bonding member 50 disposed between the chip 10 and the heat sink block 40 is improved compared with the conventional device.

Further, the device S1 can have the heat sink block 40 with the thickness out of the range between 0.5 mm and 1.5 mm, and have the edge portion 43 formed into the chamfered edge. In this case, since the edge portion 43 of the heat sink block 40 is chamfered so that the thickness of the bonding member 50 disposed at the edge portion 43 becomes thicker, the device can have similar advantage of the device S1 shown in FIG. 1. Thus, the reliability, i.e., the strength of the bonding member 50 disposed between the chip 10 and the heat sink block 40 is improved compared with the conventional device.

Furthermore, the device S1 can have another heat sink block disposed between the chip 10 and the lower heat sink 20. In this case, the other heat sink block has similar construction to the heat sink block 40.

Second Embodiment

Figure 5:
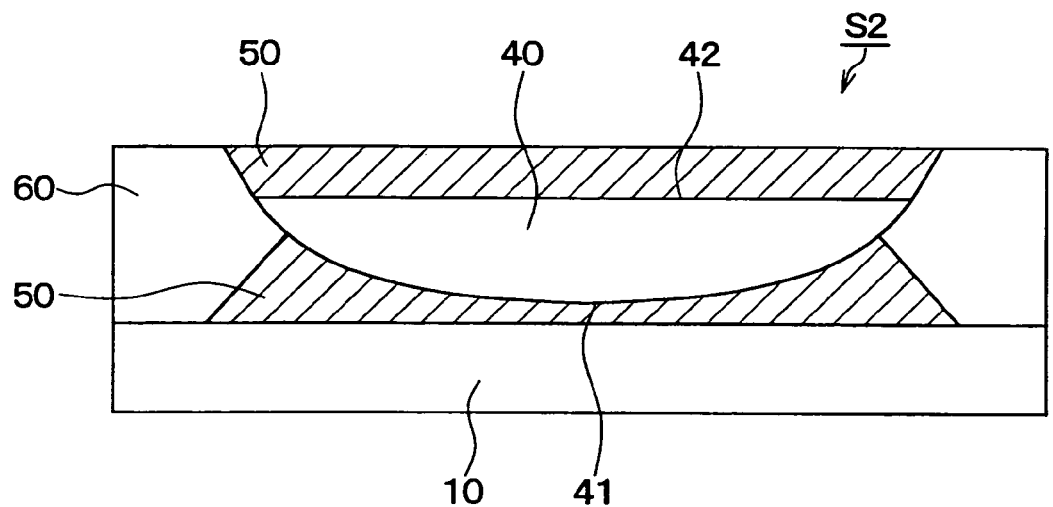
FIG. 5 is a partially enlarged cross sectional view showing a heat sink block of a semiconductor device according to a second embodiment of the present invention.

A semiconductor device S2 according to a second embodiment of the present invention is shown in FIG. 5. The bottom 41 of the heat sink block 40 disposed on the chip side is rounded. Specifically, whole bottom surface 41 of the heat sink block 40 is formed to be a spherical surface. Here, at least one of the top 42 and the bottom 41 of the heat sink block 40 can be the spherical surface. The top 42 of the heat sink block 40 is disposed on the upper heat sink side.

In FIG. 5, the bottom 41 of the heat sink block 40 disposed on the semiconductor chip side is formed into the spherical shape. However, the top 42 of the heat sink block 40 disposed on the upper heat sink side can be formed into the spherical shape. Further, both of the bottom 41 and the top 42 of the heat sink block 40 can be formed into the spherical shape. Here, the device S2 has the heat sink block 40 with the thickness in a range between 0.5 mm and 1.5 mm.

The width W of the edge portion 43 of the heat sink block 40 can be equal to or larger than 0.1 mm. Therefore, whole bottom surface 41 of the heat sink block 40 can be rounded, i.e., can be formed into the spherical shape. In this case, the device S2 has the same advantages (i.e., functions and effects) as the device S1 having the edge portion 43 of the heat sink block 40 formed into the rounded edge.

Figure 6:
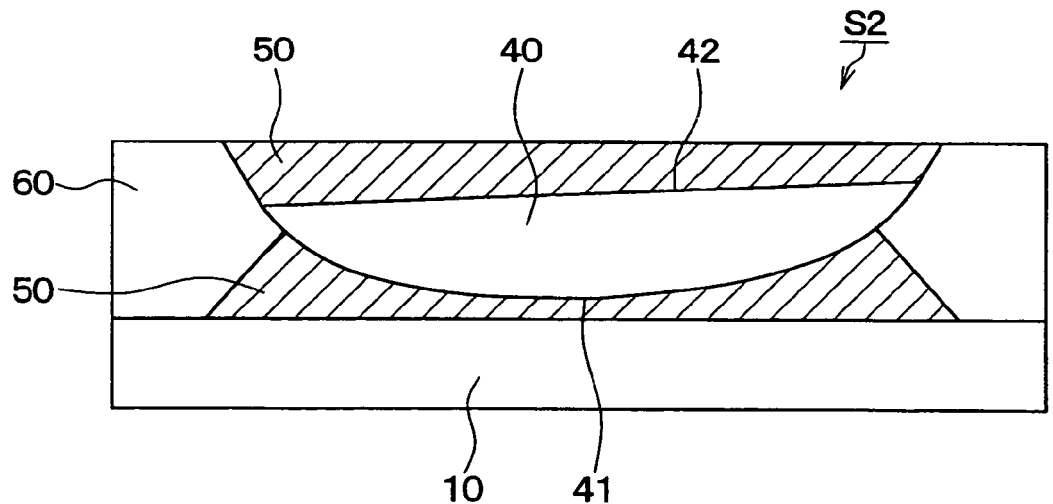
FIG. 6 is a partially enlarged cross sectional view showing the heat sink block in case of tilting, according to the second embodiment.

Further, in the device S2, even if the heat sink block 40 tilts when the heat sink block 40 is assembled, as shown in FIG. 6, the thickness of the bonding member 50 does not become thin substantially.

It is preferred that the bottom 41 of the heat sink block 40 is formed into the spherical shape. This is because the damage of the semiconductor chip 10 is limited. Further, the strain in the bonding member 50 contacting the bottom 41 of the heat sink block 40 is effectively reduced, the bottom 41 disposed on the chip side at which the stress is concentrated easily. Furthermore, the bottom 41 of the heat sink block 40 facing to the chip 10 has no corner. Therefore, even if the bonding member 50 is extremely thinned so that the chip 10 contacts the heat sink block 40, the chip 10 can be protected from damage.

The device S2 can have the heat sink block 40 with the thickness out of the range between 0.5 mm and 1.5 mm, and have the bottom 41 of the heat sink block 40 formed into the spherical shape. In this case, since the bottom 41 of the heat sink block 40 is formed into the spherical shape, so that the reliability of the bonding member 50 disposed between the chip 10 and the heat sink block 40 is improved compared with the conventional device.

Third Embodiment

Figure 7:
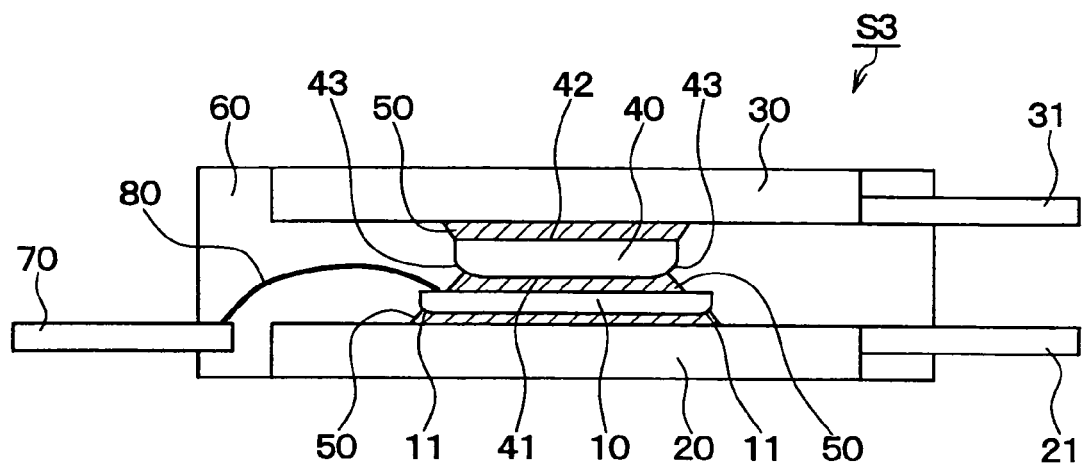
FIG. 7 is a cross sectional view showing a semiconductor device according to a third embodiment of the present invention.

A semiconductor device S3 according to a third embodiment of the present invention is shown in FIG. 7. The semiconductor chip 10 has an edge portion 11, which is rounded so that the bonding member 50 contacting the chip 10 becomes thicker. Specifically, the edge 11 of the chip 10 is formed into a R-shape so that the bonding member 50 disposed at the edge portion 11 of the chip 10 and disposed between the chip 10 and the lower heat sink 20 becomes thicker.

In FIG. 7, the device S3 has the heat sink block 40 with the rounded edge portion 43 thereof. However, the device S3 can have the heat sink block 40 having the spherical shaped bottom 41 thereof.

In this case, the device S3 has the same advantages (i.e., functions and effects) as the device S1 having the edge portion 43 of the heat sink block 40 formed into the rounded edge.

According to the FEM analysis, the stress in the bonding member 50 disposed between the chip 10 and the lower heat sink 20 is concentrated easily at the edge portion 11 of the chip 10 and the periphery thereof. Therefore, it is preferred that the edge 11 disposed on the lower heat sink side is rounded. Thus, the strain in the bonding member 50 is effectively reduced.

Fourth Embodiment

The inventors have studied about linear coefficients of thermal expansion of the heat sinks 20, 30 and the resin mold 60. When the linear coefficient of thermal expansion of the resin mold 60 is increased, a portion being easily cracked is changed from a connecting portion between the chip 10 and the heat sink block 40 to a connecting portion between the chip 10 and the lower heat sink 20. Specifically, the portion being easily cracked is changed from the bonding member 50 disposed on the top of the chip 10 (i.e., on a device formed surface of the chip 10) to the bonding member 50 disposed on the bottom of the chip 10 (i.e., on a no-device formed surface of the chip 10). Here, the heat generation element is formed on the device formed surface, and no heat generation element is formed on the no-device formed surface.

An actual semiconductor device is tested. When the linear coefficient of thermal expansion of the resin mold 60 is changed from 14 ppm/° C. to 10 ppm/° C., the crack at the bonding member disposed on the device formed surface (i.e., on the top of the chip 10) becomes larger. The crack is generated by the thermal stress at the connecting portion between the chip 10 and the bonding member 50. When the linear coefficient of thermal expansion of the resin mold 60 is changed from 14 ppm/° C. to 18 ppm/° C., the crack at the bonding member disposed on the device-formed surface (i.e., on the top of the chip 10) becomes small.

Here, it is preferred that the crack is generated at the connecting portion disposed on the no-device formed surface rather than at the connecting portion disposed on the device formed surface if the bonding member cracks. The reason is described as follows.

On the device formed surface (i.e., the top) of the chip 10, the bonding member 50 is disposed on almost whole area of a device region, which contributes to heat generation. Therefore, the bonding member 50 is not disposed on a non-device region. Specifically, the area of the bonding member 50 is smaller than the device formed surface of the chip 10. The device region and the non-device region are disposed on the device formed surface of the chip 10. An electric part such as an IGBT or the like contributing to the heat generation is formed in the device region, and no electric part is formed in the non-device region.

On the no-device formed surface (i.e., on the bottom) of the chip 10, the area of the bonding member 50 is equal to or larger than the no-device formed surface of the chip 10. Therefore, the bonding member 50 contacts a part of the no-device formed surface, which corresponds to the non-device region and does not contribute to the heat generation. The non-device region is disposed outside of the device region so that the non-device region surrounds the device region. In general, the crack is firstly generated at a periphery of the chip 10. Thus, if the crack is generated at the connecting portion on the device formed surface, the crack is generated in the bonding member 50 disposed on the device region so that the crack affects the heat radiation. Therefore, the performance of the heat radiation is reduced. If the crack is generated at the connecting portion on the non-device formed surface, the crack is generated in the bonding member 50 disposed on the part corresponding to the non-device region so that the crack does not affect the heat radiation substantially. Therefore, the performance of the heat radiation is not reduced substantially.

Thus, it is preferred that the crack is generated in the bonding member 50 disposed on the non-device formed surface if the crack is generated in the bonding member 50. In this case, the crack does not affect the heat radiation.

Figure 8:
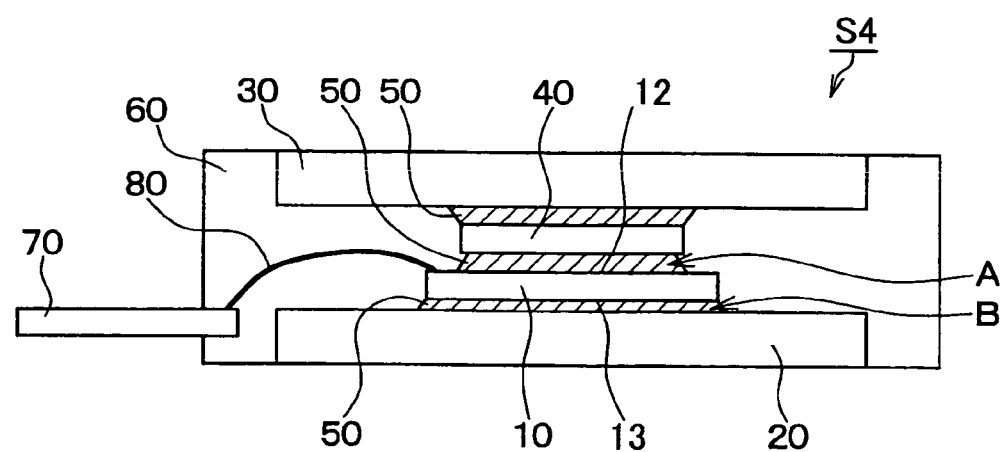
FIG. 8 is a cross sectional view showing a semiconductor device according to a fourth embodiment of the present invention.
Figure 9:
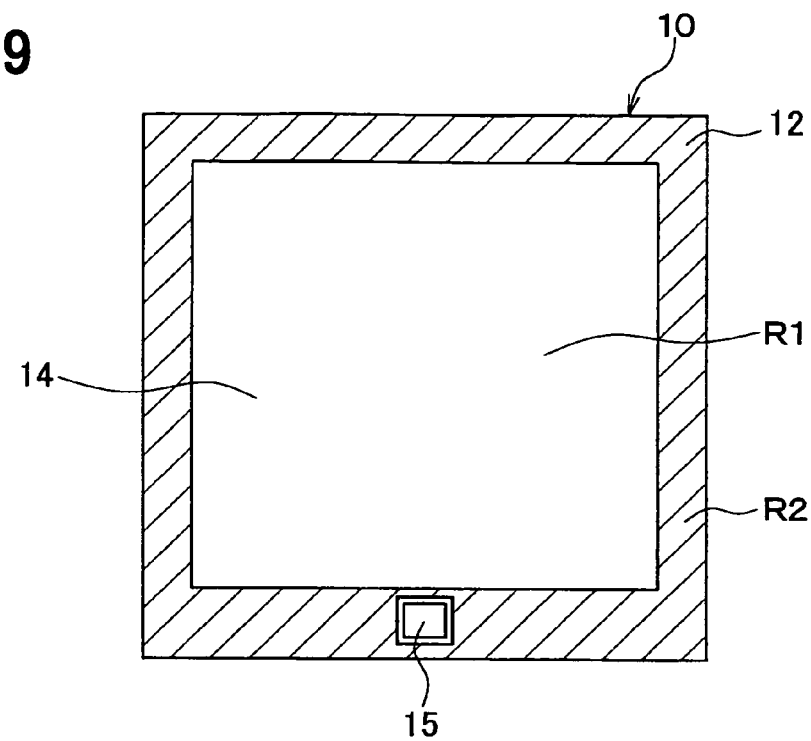
FIG. 9 is a plan view showing a semiconductor chip of the device according to the fourth embodiment.

In view of the above study, a semiconductor device S4 according to a fourth embodiment of the present invention is provided, as shown in FIG. 8. FIG. 9 shows the semiconductor chip 10. FIG. 9 is a view from a top surface 12 of the chip 10. The chip 10 is, for example, a rectangular thin plate.

In the chip 10 as a heat generation element, a part contributing to the heat generation, i.e., the part generating heat is disposed on the top surface 12 of the chip 10 (i.e., on the device formed surface). No part generating heat is disposed on the bottom surface 13 of the chip 10 (i.e., on the no-device formed surface). The bottom surface 13 is opposite to the top surface 12. The chip 10 includes the IGBT and/or the transistor, which is disposed on the top surface 12 of the chip 10. The IGBT and the transistor generate heat. The electric part contributing to the heat generation is formed in a device region R1, which is almost overlapped on an emitter electrode 14.

The chip 10 includes the device region R1 and a non-device region R2, which is disposed outside of the device region R1. No part contributing to the heat generation is formed in the non-device region R2 so that no heat is generated in the non-device region R2. Specifically, the device region R1 having a rectangular shape is disposed in a center of the chip 10 having the rectangular shape. The non-device region R2 having a rectangular frame shape is disposed outside of the device region R1 so that the non-device region R2 surrounds the device region R1. Thus, the non-device region R2 is disposed on a periphery of the chip 10. Here, the device region R1 and the non-device region R2 are disposed on the top surface 12 of the chip 10. A gate electrode 15 is formed in the non-device region R2 on the top surface 12 of the chip 10. A collector electrode (not shown) is formed on the bottom surface 13 of the chip 10.

The collector electrode is a backside electrode, and no part contributing to the heat generation is formed on the bottom surface 13.

On the top surface 12 of the chip 10, the bonding material 50 is disposed on almost whole device region R1, and is not disposed on the non-device region R2 substantially. That is, the bonding member 50 is disposed on the device region R1 precisely without any excess or shortage. Thus, no unnecessary bonding member 50 is disposed, i.e., no bonding member 50 is disposed on the non-device region R2. The heat sink block 40 is connected to the device region R1 on the top surface 12 of the chip 10 through the bonding member 50.

On the bottom surface 13 of the chip 10, the bonding member 50 is disposed on whole bottom surface 13 of the chip 10, or the bonding member 50 is disposed on a little wider area of the bottom surface 13 of the chip 10. Therefore, the bonding member 50 thermally contacts whole bottom surface 13 of the chip 10, which includes a portion corresponding to the non-device region R2 not to contribute to the heat generation substantially. The lower heat sink 20 connects to the bottom surface 13 of the chip 10 through the bonding member 50.

The upper and lower heat sinks 20, 30 and the heat sink block 40 are made of metallic material having good thermal conductivity and good electric conductivity such as copper alloy or aluminum alloy. It is preferred that the upper and lower heat sinks 20, 30 and the heat sink block 40 are made of the same material. The upper and lower heat sinks 20, 30 are electrically connected to main electrodes such as the collector electrode and the emitter electrode of the chip 10 through the bonding member 50, i.e., the solder layer. The upper and lower heat sinks 20, 30 can be a rectangular shaped plate. Further, the heat sink block 40 can be a slight small rectangular plate, which is slightly smaller than the chip 10.

The upper heat sink 30 provides the first heat radiation plate connecting to the top surface 12 of the chip 10 through the bonding member 50. The lower heat sink 20 provides the second heat radiation plate connecting to the bottom surface 13 of the chip 10 through the bonding member 50. The resin mold 60 seals the upper and lower heat sinks 20, 30, the chip 10 and the heat sink block 40. For example, the resin mold 60 seals the clearance between the upper and lower heat sinks 20, 30, and seals the periphery of the chip 10 and the heat sink block 40. The resin mold 60 is made of conventional mold material such as epoxy resin.

In the device S4, the linear coefficient of thermal expansion of the resin mold 60 is defined as $\alpha$, and the linear coefficient of thermal expansion of each of the upper and the lower heat sinks 20, 30 is defined as $\beta$. The relationship between the coefficients of $\alpha$ and $\beta$ is described as $0.8 \times \beta \leq \alpha \leq 1.5 \times \beta$.

Specifically, when the heat sinks 20, 30 are made of copper, the linear coefficient of thermal expansion $\alpha$ of the resin mold 60 is in a range between 14 ppm/° C. and 25 ppm/° C. Preferably, the linear coefficient of thermal expansion $\alpha$ is in a range between 16 ppm/° C. and 20 ppm/° C. Further, the Young's modulus of the resin mold 60 is in a range between 6 GPa and 24 GPa. Here, the linear coefficient of thermal expansion $\beta$ of the upper and the lower heat sinks 20, 60 is 17 ppm/° C.

The linear coefficient of thermal expansion $\alpha$ and the Young's modulus of the resin mold 60 is controlled by adjusting a filler in the epoxy resin in a case where the resin mold 60 is made of epoxy resin as a base material.

Figure 10:
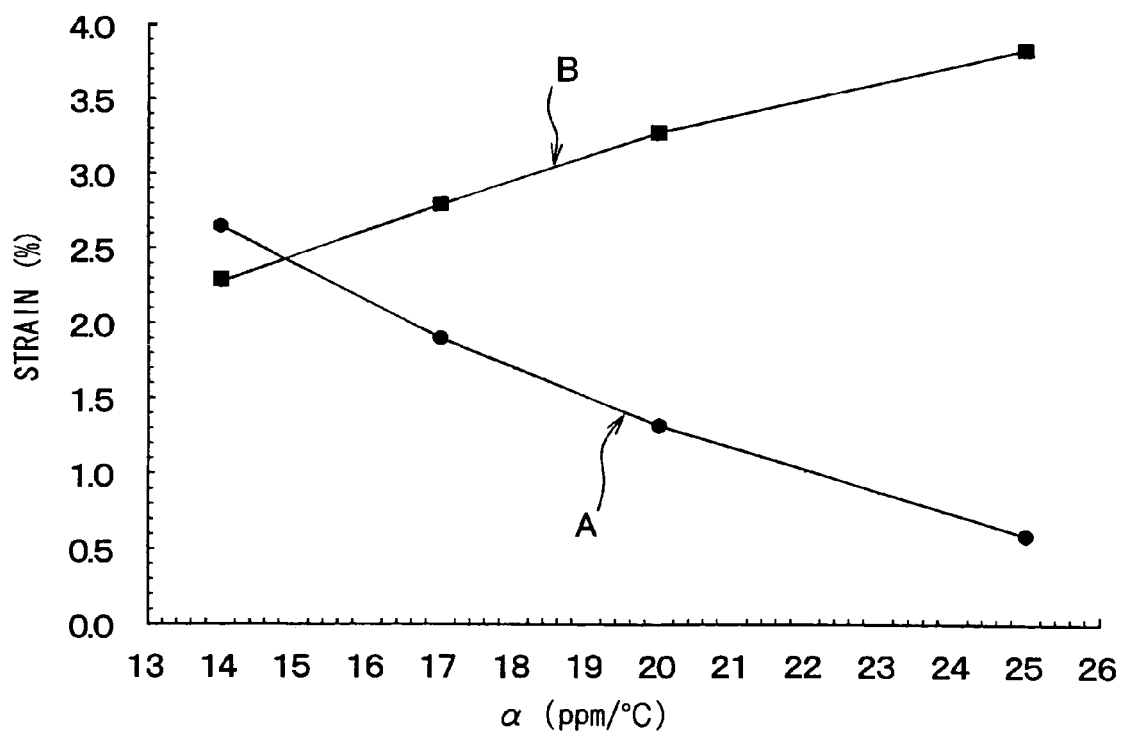
FIG. 10 is a graph showing a relationship between a linear coefficient of thermal expansion $\alpha$ of a resin mold and a shear plastic strain.

Next, the reason why the relationship between the coefficients of $\alpha$ and $\beta$ is set to be $0.8 \times \beta \leq \alpha \leq 1.5 \times \beta$ is described as follows. FIG. 10 is a graph showing a relationship between the shear plastic strain in the bonding member 50 of the device S4, which is obtained by the FEM analysis. Specifically, the curve A in FIG. 10 shows the strain in the bonding member 50 disposed on the chip 10, i.e., the bonding member 50 is disposed on the top surface 12 of the chip 10, which is shown as A in FIG. 8. The curve B in FIG. 10 shows the strain in the bonding member 50 disposed under the chip 10, i.e., the bonding member 50 is disposed on the bottom surface 13 of the chip 10, which is shown as B in FIG. 8. Here, the heat sinks 20, 30 are made of copper. The bonding member 50 is made of Sn—Cu—Ni (i.e., tin-copper-nickel) series solder, which has a linear coefficient of thermal expansion of 23 ppm/° C. The strain in the bonding member 50 is analyzed at points, which are pointed out by arrows of A and B in FIG. 8. Specifically, the points in the bonding member 50 are disposed at the periphery of the chip 10.

As shown in FIG. 10, as the linear coefficient of thermal expansion $\alpha$ of the resin mold 60 becomes larger than 15 ppm/° C., the strain in the bonding member 50 disposed at the point B is increased. This means that the bonding member 50 disposed under the chip 10 is easily ruptured (i.e., cracked) by the thermal cycle stress as the linear coefficient of thermal expansion $\alpha$ of the resin mold 60 becomes larger than 15 ppm/° C. On the other hand, as the linear coefficient of thermal expansion $\alpha$ of the resin mold 60 becomes larger than 15 ppm/° C., the strain in the bonding member 50 disposed at the point A is decreased. This means that the bonding member 50 disposed on the chip 10 is easily ruptured (i.e., cracked) by the thermal cycle stress as the linear coefficient of thermal expansion $\alpha$ of the resin mold 60 becomes smaller.

Thus, when the linear coefficient of thermal expansion $\alpha$ of the resin mold 60 is smaller than 15 ppm/° C., the strain in the bonding member 50 disposed at the point A is larger than that at the point B. When the linear coefficient of thermal expansion $\alpha$ of the resin mold 60 is larger than 15 ppm/° C., the strain in the bonding member 50 disposed at the point B is larger than that at the point A. This is, a part of the bonding member 50, which is easily cracked, is disposed on the top surface 12 of the chip 10 when the linear coefficient $\alpha$ is smaller than 15 ppm/° C. The part being easily cracked is disposed on the bottom surface 13 of the chip 10 when the linear coefficient $\alpha$ is larger than 15 ppm/° C. Thus, the part being easily cracked is changed from the part on the top surface 12 to the part on the bottom surface 13 as the linear coefficient $\alpha$ of the resin mold 50 becomes larger.

Therefore, the linear coefficient $\alpha$ of the resin mold 50 is set to be larger than 15 ppm/° C. so that the bonding member 50 disposed on the bottom surface 13 of the chip 10 is easily cracked. Specifically, the part being easily cracked is controlled to be the bonding member 50 disposed on the bottom surface 13 of the chip 10 by setting the linear coefficient $\alpha$ to be larger than 15 ppm/° C. In this case, even if the crack is generated in the bonding member, the crack does not affect the heat radiation so that the performance of the heat radiation is not reduced substantially.

As shown in FIG. 10, the part being easily cracked is changed at the linear coefficient $\alpha$ of 15 ppm/° C. Actually, the device S4 has been tested by changing the linear coefficient $\alpha$ of the resin mold 60. The result shows that the part being easily cracked is changed at the linear coefficient $\alpha$ of 14 ppm/° C. Thus, the critical value of the linear coefficient α, at which the part being easily cracked is changed, and which is obtained by the actual test, is almost the same as the value obtained by the FEM analysis shown in FIG. 10.

Thus, when the relationship between the linear coefficient α of the resin mold 60 and the linear coefficient β of the heat sinks 20, 30 is $0.8 \times \beta \leq \alpha$, the strain in the bonding member 50 disposed on the top surface 12 of the chip 10 becomes small, and the strain in the bonding member 50 disposed on the bottom surface 13 of the chip 10 becomes large in a case where the thermal stress is applied to the device S4.

Here, the upper limit of the linear coefficient α of the resin mold 60 is determined in reference to the prior art disclosed in Japanese Patent Application Publication No. 2003-110064. The relationship between the linear coefficient α of the resin mold 60 and the linear coefficient β of the heat sinks 20, 30 is set to be $\alpha \leq 1.5 \times \beta$.

Accordingly, the relationship between the coefficients of α and β is set to be $0.8 \times \beta \leq \alpha \leq 1.5 \times \beta$. In this case, the part being easily cracked by the thermal stress is controlled to be the bonding member 50 disposed on the bottom surface 13 of the chip 10.

Here, when the heat sinks 20, 30 are made of copper, i.e., when the linear coefficient β of the heat sinks 20, 30 is 17 ppm/° C., the linear coefficient of thermal expansion α of the resin mold 60 is set to be in a range between 14 ppm/° C. and 25 ppm/° C. so that the relationship between the coefficients of α and β is $0.8 \times \beta \leq \alpha \leq 1.5 \times \beta$.

Preferably, the linear coefficient of thermal expansion α of the resin mold 60 is set to be in a range between 16 ppm/° C. and 20 ppm/° C. when the heat sinks 20, 30 are made of copper. This reason is described as follows.

The linear coefficient α of the resin mold 60 has manufacturing variations, for example, about ±2 ppm/° C. Therefore, preferably, the lower limit of the linear coefficient α is 16 ppm/° C.

In general, a filler is added in the base material composing the resin mold 60 so that the linear coefficient α of the resin mold 60 is changed. When the filler is added in the base material, the linear coefficient α of the resin mold 60 is reduced. Therefore, it is difficult to increase the linear coefficient α of the resin mold 60 without changing the base material. Further, when the linear coefficient α of the resin mold 60 becomes large, the strain in the bonding member 50 disposed under the chip 10 becomes larger. Therefore, in view of considering the balance of the strains in the bonding members disposed on and under the chip 10, it is preferred that the upper limit of the linear coefficient α of the resin mold 60 is about 20 ppm/° C.

When the linear coefficient α of the resin mold 60 is changed, the Young' modulus of the resin mold 60 is also changed. However, when the Young' modulus of the resin mold 60 is in a range between 6 GPa and 24 Gpa, the stress and the strain in each part of the device S4 is not affected substantially. This result is obtained by the FEM analysis.

Here, the chip 10 can be another chip as long as the chip includes a device formed surface having a device contributing to heat generation and another no-device formed surface having no device contributing to the heat generation. The device formed surface is opposite to the other no-device formed surface.

Further, if it is not necessary, the device S4 can have no heat sink block 40.

Fifth Embodiment

Figure 11:
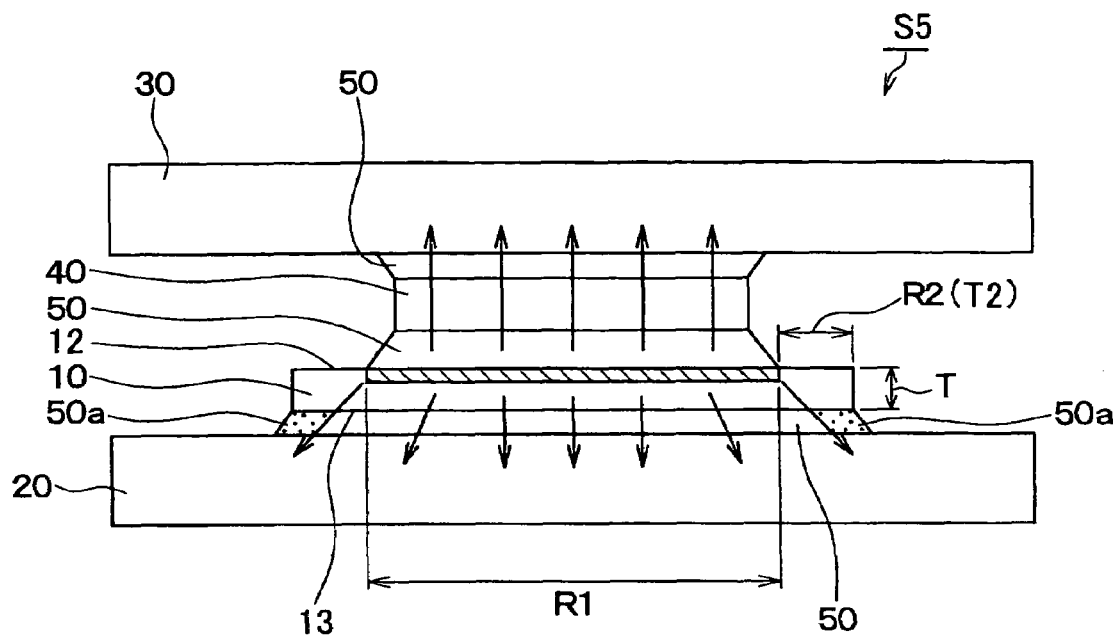
FIG. 11 is a cross sectional view showing a semiconductor device according to a fifth embodiment of the present invention.

A semiconductor device S5 according to a fifth embodiment of the present invention is shown in FIG. 11. In FIG. 11, the resin mold 60, the lead frame 70 and the wire 80 are skipped to describe.

The non-device region R2 has a width T2, which is equal to or larger than the thickness T of the chip 10. This reason is described as follows.

The device region R1 is disposed inside of the non-device region R2. The bonding member 50 on the top surface 12 of the chip 10 is disposed just on the device region R1. On the bottom surface 13 of the chip 10, the bonding member 50 disposed on the bottom surface 13 of the chip 10 is equal to or wider than whole bottom surface 12 of the chip 10.

In FIG. 11, arrows represent heat generated in the chip 10, i.e., generated from the device region R1 of the chip 10. The heat conducts and radiates along with the arrows. At the edge portion of the chip 10, i.e., at the edge of the device region R1, the heat conducts from the bottom surface 13 obliquely downward. Specifically, the heat conducts toward a direction having a 45-degree angle from the bottom surface 13. This is because the conduction, i.e., the speed of the conduction of the heat conducting toward the vertical direction is almost equal to that conducting toward the horizontal direction.

Since the heat conducts toward the direction of the 45-degree angle from the bottom surface 13 of the chip 10, a corner portion 50a, which is shown in a dotted area in FIG. 11, does not contribute the heat conduction substantially. The corner portion 50a is disposed in the bonding member 50, disposed under the chip 10 and disposed above a 45-degree arrow in FIG. 11. Even if the bonding member 50 in the corner portion 50a is cracked, the crack in the corner portion 50a does not affect the heat radiation.

Here, when the thickness T of the chip 10 is equal to or smaller than the width T2 of the non-device region R2, the corner portion 50a disposed at the edge of the bonding member 50 can be provided. This is because the heat conducts toward the direction of the 45-degree angle from the bottom surface 13 of the chip 10. Even if the bonding member 50 in the corner portion 50a is cracked, the heat radiation performance is not affected.

In general, the crack in the bonding member 50 caused by the thermal stress in the bonding member 50 generates at the edge of the bonding member 50. Specifically, the crack firstly generates in the corner portion 50a. If the crack is generates in the corner portion 50a, the crack does not affect the heat radiation.

In the device S5, the part being easily cracked by the thermal stress is controlled to be the bonding member 50 disposed on the bottom surface 13 of the chip 10. Therefore, even if the bonding member is cracked, the crack is generated in the corner portion 50a so that the crack does not affect the heat radiation performance.

Further, in the device S5, the relationship between the linear coefficient α of the resin mold 60 and the linear coefficient β of the heat sinks 20, 30 can be set to be $0.8 \times \beta \leq \alpha \leq 1.5 \times \beta$. In this case, the part being easily cracked by the thermal stress is much preferably controlled to be the bonding member 50 disposed on the bottom surface 13 of the chip 10.

Sixth Embodiment

Figure 12:
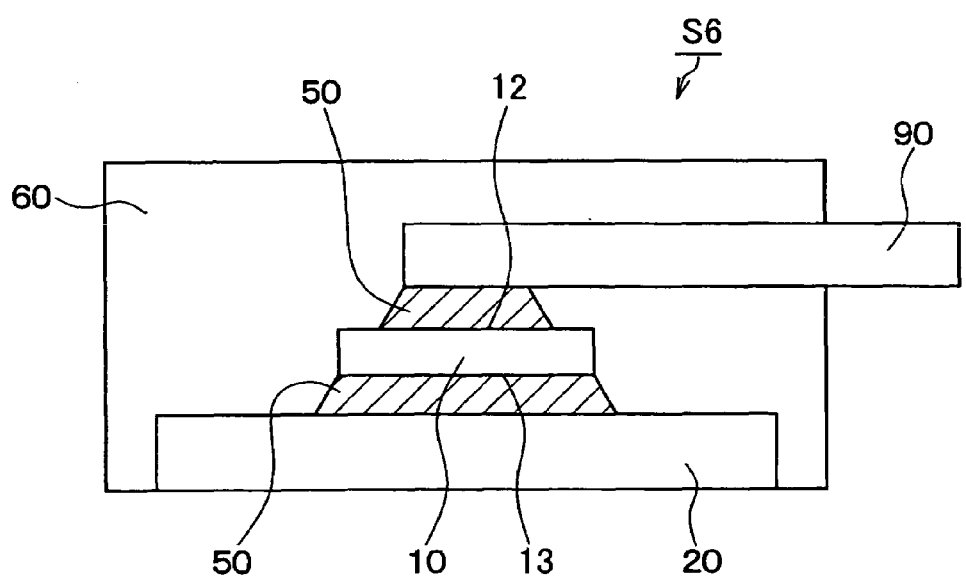
FIG. 12 is a cross sectional view showing a semiconductor device according to a sixth embodiment of the present invention.
Figure 13:
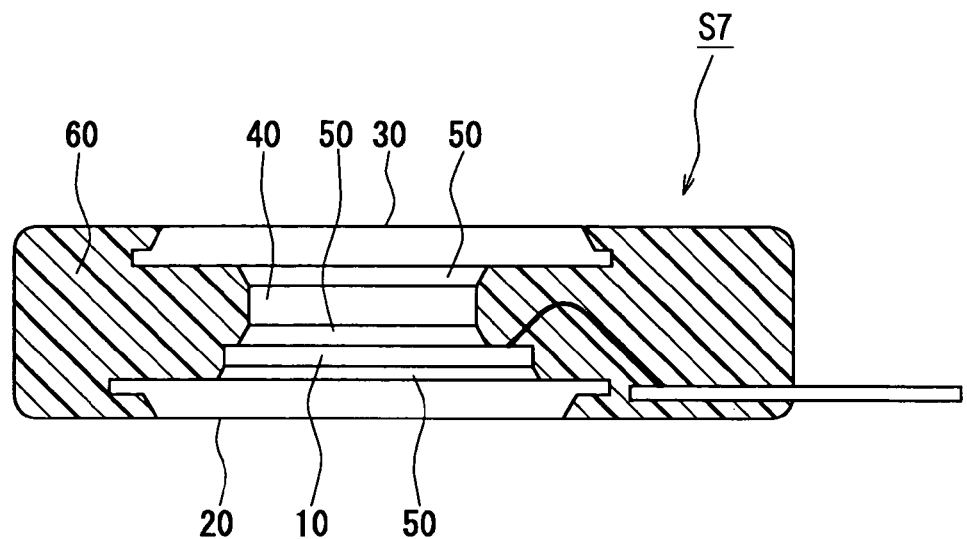
FIG. 13 is a cross sectional view showing a semiconductor device according to a seventh embodiment of the present invention.
Figure 14:
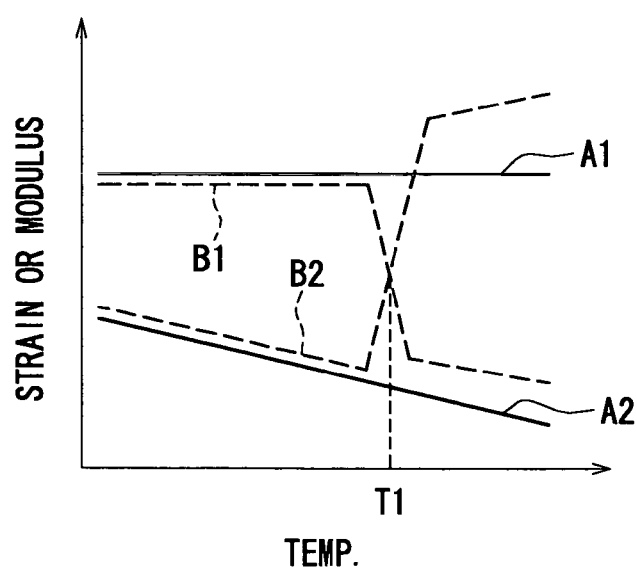
FIG. 14 is a graph showing a relationship among a Young's modulus, a strain and a temperature, according to the seventh embodiment.

A semiconductor device S6 according to a sixth embodiment of the present invention is shown in FIG. 12. In the device S6, only the lower heat sink 20 as a heat radiation plate is formed on the bottom surface 13 of the chip 10 through the bonding member 50. On the top surface 12 of the chip 10, which includes the device region R1, a wire terminal 90 is electrically connected to the top surface 12 through the bonding member 50.

The wire terminal 90 is made of conductive material, and a part of the wire terminal 90 protrudes from the resin mold 60. The protruding part of the wire terminal 90 electrically connects to an external circuit.

In the device S6, the relationship between the linear coefficient α of the resin mold 60 and the linear coefficient β of the heat sink 20 and the wire terminal 90 can be set to be $0.8 \times \beta \leq \alpha \leq 1.5 \times \beta$. This relationship provides the same advantages (i.e., the functions and the effects) as the device S4 shown in FIG. 8. Specifically, the strain in the bonding member 50 disposed on the top surface 12 of the chip 10 becomes small, and the strain in the bonding member 50 disposed on the bottom surface 13 of the chip 10 becomes large in a case where the thermal stress is applied to the device S6. Therefore, the part being easily cracked by the thermal stress is preferably controlled to be the bonding member 50 disposed on the bottom surface 13 of the chip 10.

The wire terminal 90 can be made of the same material as the lower heat sink 20. Preferably, when the heat sink 20 and the wire terminal 90 are made of copper, the linear coefficient of thermal expansion α of the resin mold 60 is in a range between 14 ppm/° C. and 25 ppm/° C. More preferably, the linear coefficient of thermal expansion α is in a range between 16 ppm/° C. and 20 ppm/° C. Furthermore, preferably, the Young's modulus of the resin mold 60 is in a range between 6 GPa and 24 GPa.

Further, the thickness T of the chip 10 can be equal to or smaller than the width T2 of the non-device region R2.

Seventh Embodiment

A semiconductor device S7 according to a seventh embodiment of the present invention is shown in FIG. 12. In the device S7, the distance between the upper surface of the lower heat sink 20 and the lower surface of the upper heat sink 30 is, for example, in a range between 1 mm and 2 mm. The resin mold 60 seals the clearance between the heat sinks 20, 30 and the periphery of the chip 10 and the heat sink block 40. When the resin mold 60 seals the heat sinks 20, 30 and the like, the molding tool (not shown) composed of upper and lower molding tools is used for molding. Preferably, a coating resin material such as poly-amide resin (not shown) is applied on the surfaces of the heat sink 20, 30, the heat sink block 40 and the chip 10 so that the adhesive force between the resin mold 60 and the heat sinks 20, 30, the adhesive force between the resin mold 60 and the chip 10, and the adhesive force between the resin mold 60 and the heat sink block 40 become larger.

The resin mold 60 is, for example, made of epoxy resin or the like, which is different from a conventional epoxy resin. The glass transition temperature Tg of the epoxy resin in the device S7 is higher than that of the conventional epoxy resin. Specifically, the glass transition temperature Tg of the conventional epoxy resin is about 100° C. to 130° C. However, the glass transition temperature Tg of the epoxy resin in the device S7 is equal to or higher than 150° C. This is because the upper limit of operating temperature of the device S7 is 150° C. in a case where the device S7 is used for an automotive vehicle (including an electric powered vehicle). Here, the upper limit of the device S7 is assured.

If the conventional epoxy resin is used for the device S7, and the device S7 is used in an operating temperature, for example, about 140° C. to 150° C., which is higher than the glass transition temperature Tg, the Young's modulus of the resin mold 60 is rapidly reduced, so that the thermal expansion coefficient of the resin mold 60 is rapidly increased. Therefore, the compression stress in the chip 10 is released so that the strain at a connecting portion between the chip 10 and the lower heat sink 20 is increased. Thus, the endurance of the connecting portion is reduced.

FIG. 2 shows a relationship among the Young's modulus and the strain in the resin mold 60 and the usage temperature. Specifically, a broken line B1 shows the relationship between the Young's modulus in the resin mold 60 made of the conventional epoxy resin and the atmospheric temperature around the device S7. Another broken line B2 shows the relationship between the strain at the connecting portion in the resin mold 60 made of the conventional epoxy resin and the atmospheric temperature around the device S7. A solid line A1 shows the relationship between the Young's modulus in the resin mold 60 made of the present epoxy resin and the atmospheric temperature around the device S7. Another solid line A2 shows the relationship between the strain at the connecting portion in the resin mold 60 made of the present epoxy resin and the atmospheric temperature around the device S7. Here, the temperature T1 is a glass transition temperature Tg of the conventional epoxy resin.

The glass transition temperature Tg of the present epoxy resin is equal to or higher than 150° C. Therefore, in the operating temperature lower than 150° C., the Young's modulus of the resin mold 60 made of the present epoxy resin is not changed substantially. Therefore, the thermal expansion coefficient of the resin mold 60 made of the present epoxy resin is not changed substantially. Thus, the compression stress for holding the chip 10 is sufficiently secured so that the compression stress is limited from being released. Thus, the strain at the connecting portion is suppressed so that the endurance at the connecting portion is increased.

Figure 15A:
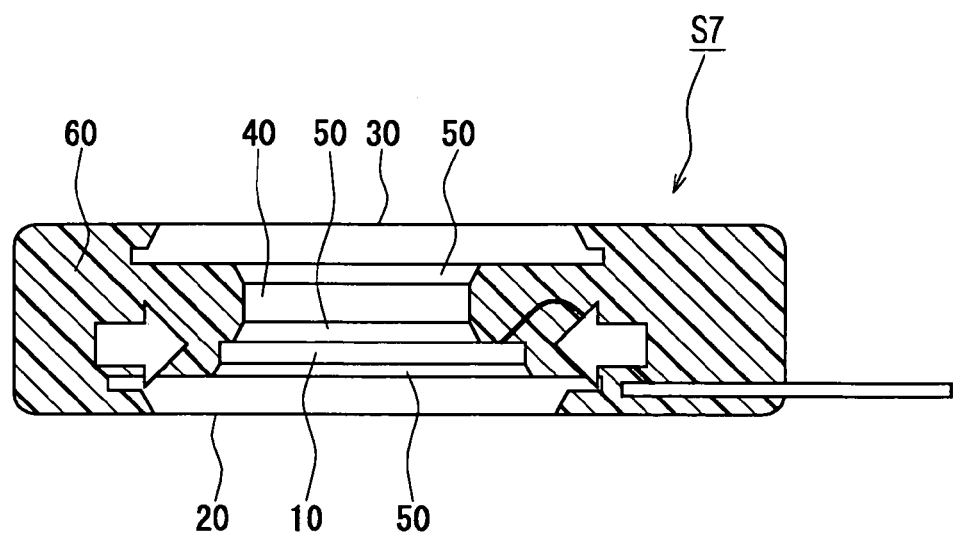
FIG. 15A is a cross sectional view of the semiconductor device explaining a large compression stress.
Figure 15B:
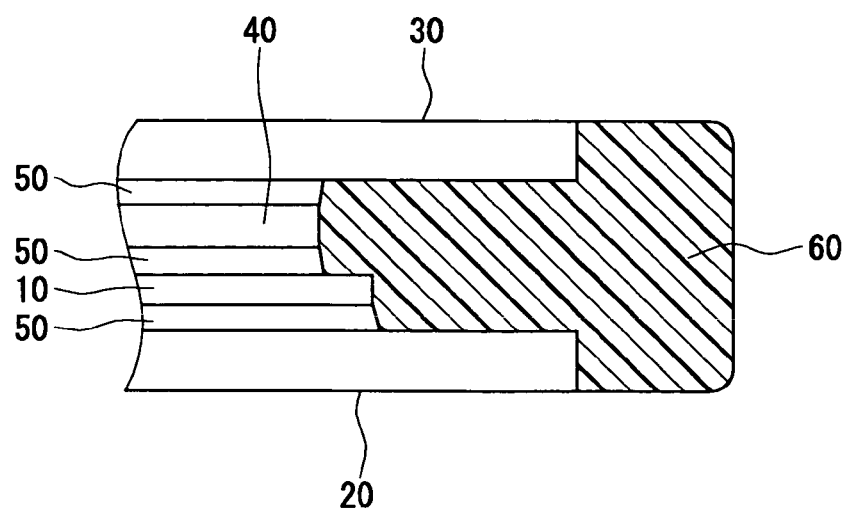
FIG. 15B is a partially enlarged cross sectional view explaining the large compression stress, according to the seventh embodiment.

FIG. 15A explains the compression stress for holding the chip 10, which affects to the chip sufficiently. A pair of arrows in FIG. 15A represents the compression stress. FIG. 15B explains the strain at the connecting portion of the device S7, which is suppressed.

Figure 16A:
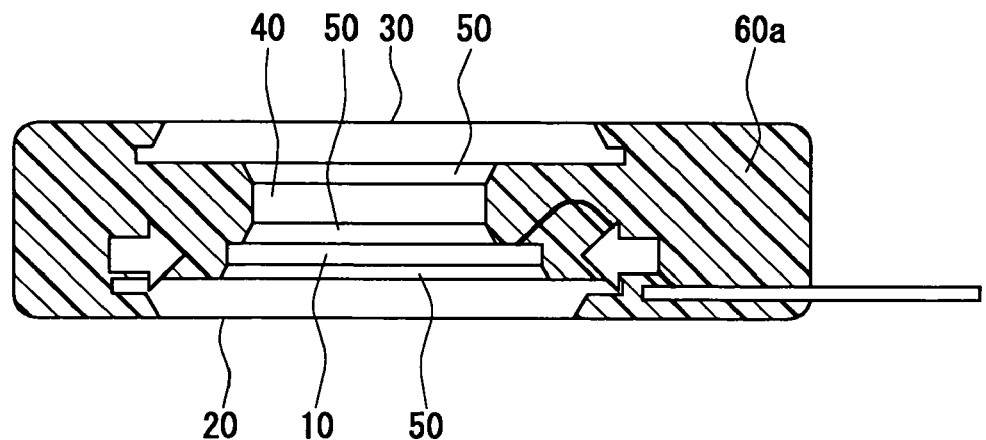
FIG. 16A is a cross sectional view of the semiconductor device explaining a small compression stress.
Figure 16B:
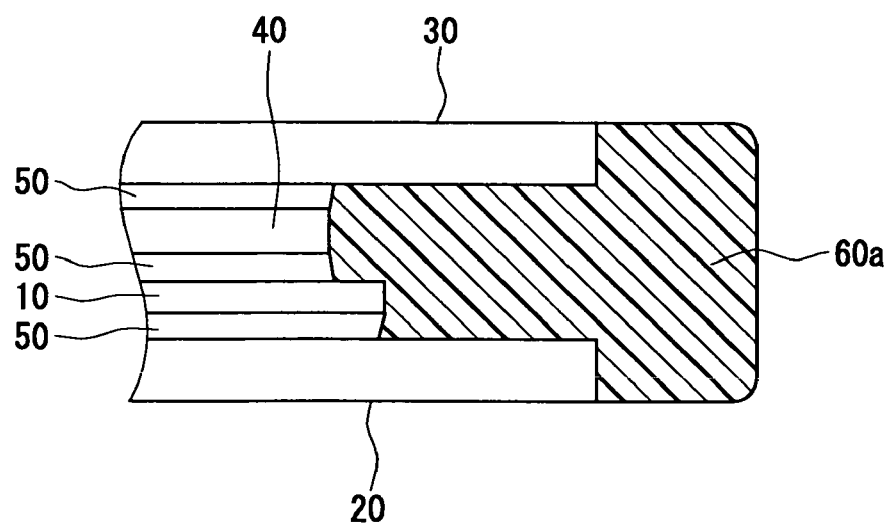
FIG. 16B is a partially enlarged cross sectional view explaining the small compression stress, according to the seventh embodiment.

FIG. 16A explains the compression stress for holding the chip 10 molded with the conventional epoxy resin, the compression stress which becomes smaller than that in FIG. 15A. A pair of arrows in FIG. 16A represents the compression stress. FIG. 16B explains the strain at the connecting portion of the device S7 having the conventional epoxy resin mold, the strain which becomes larger than that in FIG. 15B. Here, a resin mold 60a is made of the conventional epoxy resin, which is different from the resin mold 60 in the device S7.

The glass transition temperature Tg of the resin mold 60 becomes higher in a following manner. The first method for increasing the glass transition temperature. Tg is such that a functional group (i.e., a side chain) in the epoxy resin is increased. The second method is such that benzene ring in the epoxy resin is chained into a circular form so that a cross-link is shortened to increase a cross-link density. Here, a well-known resin having high glass transition temperature is, for example, a resin having a benzene ring chained linearly or a resin having a small amount of a side chain. The third method is such that an amount of the filler in the epoxy resin is controlled to increase the glass transition temperature Tg. The above three methods are combined appropriately so that the glass transition temperature Tg of the resin mold 60 is increased up to a predetermined temperature, which is equal to or higher than 150° C.

Figure 17:
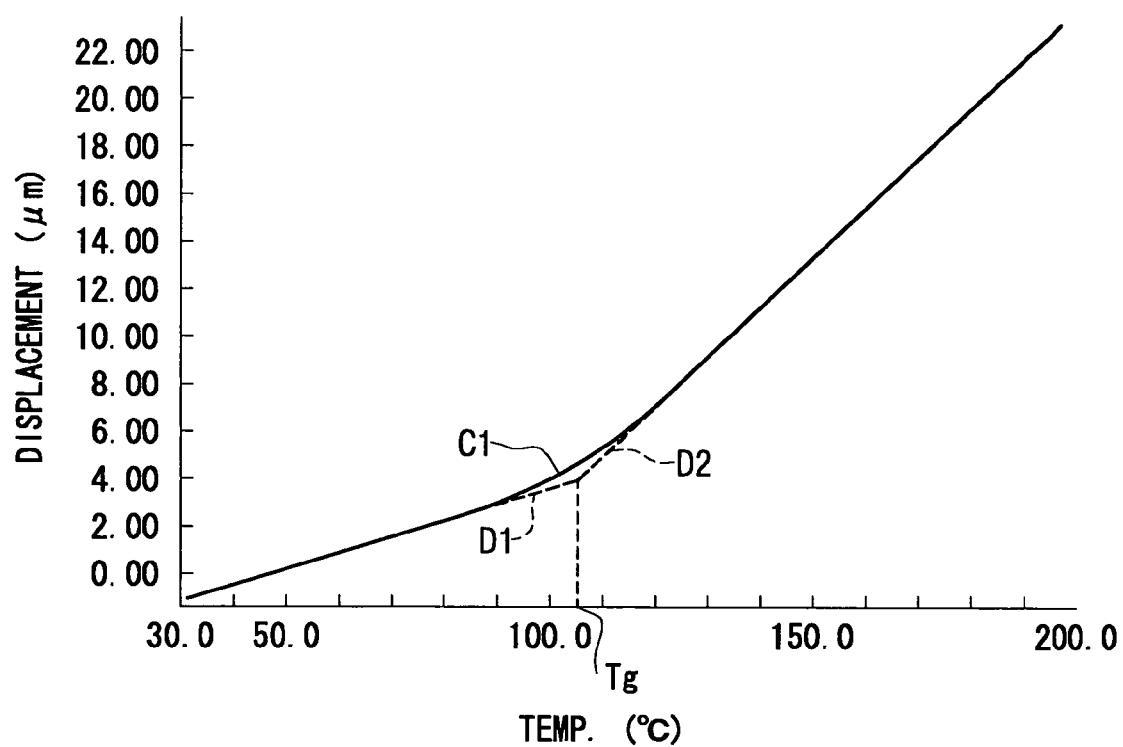
FIG. 17 is a graph explaining a TMA method for defining a glass transition temperature, according to the seventh embodiment.

In this embodiment, the glass transition temperature Tg is measured by a well-known TMA method (i.e., thermomechanical analysis method) so that the glass transition temperature Tg is controlled. The glass transition temperature Tg is obtained by the TMA method as follows. When the temperature is increased, a displacement is also increased. Thus, the change of the displacement in accordance with the temperature change is measured so that the change of the displacement is approximated by two straight lines. Two straight lines intersect at one point, which is defined as the glass transition temperature Tg. Specifically, as shown in FIG. 17, the glass transition temperature Tg of the resin mold 60 is obtained. Here, a horizontal axis shows the temperature (° C.) and a vertical axis shows a displacement (e.g., meter, millimeter or the like). A solid curve C1 represents an amount of expansion (or compression) of the resin mold 60 when the temperature of the resin mold 60 is changed. The solid curve C1 is approximated by two broken lines D1, D2 so that the glass transition temperature Tg is obtained.

In the device S7, the Young's modulus of the resin mold 60 is set to be equal to or smaller than 20 GPa in a temperature range equal to or lower than the glass transition temperature Tg. This is because the stress generated in the resin mold 60 becomes larger than the adhesive force of the epoxy resin in a case where the Young's modulus is larger than 20 GPa.

In the device S7, the difference of the thermal expansion coefficient between the resin mold 60 and the heat sink 20, 30 is equal to or smaller than 50% when the temperature is equal to or lower than the glass transition temperature Tg. This is, the epoxy resin composing the resin mold 60 has the thermal expansion coefficient equal to or smaller than time and a half of the thermal expansion coefficient of the heat sink 20, 30 made of, for example, metallic material. This is because the stress generated in the resin mold 60 becomes larger than the adhesive force of the epoxy resin in a case where the difference of the thermal expansion coefficient is larger than 50%.

Thus, the resin mold 60 for sealing almost all of the device S7 has the glass transition temperature Tg equal to or higher than the upper limit of the operating temperature of the device S7. The upper limit is, for example, 150° C. Therefore, when the device S7 is used in an ordinary operating temperature range, the compression stress is applied to the chip 10 sufficiently. Accordingly, even if a large thermal stress is applied to the device S7, the strain at the connecting portion is reduced.

Further, since the Young's modulus of the epoxy resin composing the resin mold 60 is set to be equal to or smaller than 20 GPa when the temperature is equal to or lower than the glass transition temperature Tg, the stress generated in the resin mold 60 is limited from exceeding over the adhesive force of the epoxy resin. Furthermore, since the difference of the thermal expansion coefficient between the resin mold 60 and the heat sink 20, 30 is equal to or smaller than 50% when the temperature is equal to or lower than the glass transition temperature Tg, the stress generated in the resin mold 60 is limited from exceeding over the adhesive force of the epoxy resin.

In the device S7, at least one of the heat sinks 20, 30 can have the thickness, which is five times larger than the thickness of the chip 10. In this case, the strain at the connecting portion in the device S7 is much reduced, so that the device S7 is protected from being broken.

Such changes and modifications are to be understood as being within the scope of the present invention as defined by the appended claims.

What is claimed is:

1. A semiconductor device comprising:
 a heat generation element;
 a bonding member;
 first and second heat radiation plates disposed on first and second sides of the heat generation element through the bonding member, respectively;
 a heat radiation block disposed between the first heat radiation plate and the heat generation element through the bonding member; and
 a resin mold molding almost all of the device,
 wherein the first and second heat radiation plates are capable of radiating heat generated from the heat generation element,
 wherein the heat generation element electrically and thermally connects to the first heat radiation plate through the bonding member and the heat radiation block,
 wherein the heat generation element electrically and thermally connects to the second heat radiation plate through the bonding member,
 wherein the heat radiation block has a thickness in a range between 0.5 mm and 1.5 mm, and
 wherein the heat generation element has an edge portion with no corner so that the bonding member disposed at the edge portion becomes thick.

2. The device according to claim 1,
 wherein the edge portion with no corner is a rounded edge or a chamfered edge.

3. The device according to claim 2,
 wherein the second side of the heat generation element has the edge portion with no corner, and
 wherein the second side of the heat generation element faces the second heat radiation plate through the bonding member.

4. A semiconductor device comprising:
 a heat generation element;
 a bonding member;
 first and second heat radiation plates disposed on first and second sides of the heat generation element through the bonding member, respectively;
 a heat radiation block disposed between the first heat radiation plate and the heat generation element through the bonding member; and
 a resin mold molding almost all of the device,
 wherein the first and second heat radiation plates are capable of radiating heat generated from the heat generation element,
 wherein the heat generation element electrically and thermally connects to the first heat radiation plate through the bonding member and the heat radiation block,
 wherein the heat generation element electrically and thermally connects to the second heat radiation plate through the bonding member, and
 wherein the heat radiation block has an edge portion with no corner so that the bonding member disposed at the edge portion becomes thick.

5. The device according to claim 4,
 wherein the edge portion with no corner is a rounded edge or a chamfered edge.

6. The device according to claim 4,
wherein the edge portion has a width equal to or larger than 0.1 mm and a height in a range between 0.05 mm and 0.20 mm.
7. The device according to claim 4,
wherein the heat radiation block has a surface having the edge portion with no corner, and
wherein the surface of the heat radiation block faces the heat generation element through the bonding member.
8. The device according to claim 4,
wherein the heat radiation block has a thickness in a range between 0.5 mm and 1.5 mm.
9. The device according to claim 4,
wherein the heat radiation block is made of copper alloy, aluminum alloy or iron alloy.
10. The device according to claim 4,
wherein the heat radiation block has a Young's modulus in a range between 60 GPa and 240 GPa.
11. The device according to claim 4,
wherein the heat generation element has an edge portion with no corner so that the bonding member disposed at the edge portion becomes thick.
12. The device according to claim 11,
wherein the edge portion with no corner in the heat generation element is a rounded edge or a chamfered edge.
13. The device according to claim 12,
wherein the second side of the heat generation element has the edge portion with no corner, and
wherein the second side of the heat generation element faces the second heat radiation plate through the bonding member.
14. A semiconductor device comprising:
a heat generation element;
a bonding member;
first and second heat radiation plates disposed on first and second sides of the heat generation element through the bonding member;
a heat radiation block disposed between the first heat radiation plate and the heat generation element through the bonding member; and
a resin mold molding almost all of the device,
wherein the first and second heat radiation plates are capable of radiating heat generated from the heat generation element,
wherein the heat generation element electrically and thermally connects to the first heat radiation plate through the bonding member and the heat radiation block,
wherein the heat generation element electrically and thermally connects to the second heat radiation plate through the bonding member,
wherein the heat radiation block has first and second surfaces,
wherein the first surface of the heat radiation block is disposed on a first heat radiation plate side, and the second surface of the heat radiation block is disposed on a heat generation element side, and
wherein at least one of the first and second surfaces of the heat radiation block has a spherical shape.
15. The device according to claim 14,
wherein the heat radiation block has a thickness in a range between 0.5 mm and 1.5 mm.
16. The device according to claim 14,
wherein the heat radiation block is made of copper alloy, aluminum alloy or iron alloy.
17. The device according to claim 14,
wherein the heat radiation block has a Young's modulus in a range between 60 GPa and 240 GPa.
18. The device according to claim 14,
wherein the heat generation element has an edge portion with no corner so that the bonding member disposed at the edge portion becomes thick.
19. The device according to claim 18,
wherein the edge portion with no corner in the heat generation element is a rounded edge or a chamfered edge.
20. The device according to claim 19,
wherein the second side of the heat generation element has the edge portion with no corner, and
wherein the second side of the heat generation element faces the second heat radiation plate through the bonding member.
21. A semiconductor device comprising:
a heat generation element;
a bonding member;
first and second heat radiation plates disposed on first and second sides of the heat generation element through the bonding member; and
a resin mold molding almost all of the device,
wherein the first and second heat radiation plates are capable of radiating heat generated from the heat generation element,
wherein the heat generation element electrically and thermally connects to the first and second heat radiation plates through the bonding member,
wherein the resin mold has a glass transition temperature, which is equal to or higher than an upper limit of an operating temperature of the device,
wherein the resin mold includes a filler for controlling a linear coefficient of thermal expansion and Young's modulus of the resin mold.
22. The device according to claim 21,
wherein the resin mold has a Young's modulus, which is equal to or smaller than 20 GPa in a temperature range equal to or lower than the glass transition temperature.
23. The device according to claim 21,
wherein the resin mold is made of epoxy resin having a thermal expansion coefficient, which is equal to or smaller than time and a half of a thermal expansion coefficient of the first and second heat radiation plates.
24. The device according to claim 21,
wherein the glass transition temperature of the resin mold is equal to or larger than 150° C.

* * * * *